(12) United States Patent
Kim et al.

(10) Patent No.: US 9,786,861 B2
(45) Date of Patent: Oct. 10, 2017

(54) WHITE ORGANIC LIGHT EMITTING DEVICE

(71) Applicant: LG Display Co., Ltd., Seoul (KR)

(72) Inventors: Shin-Han Kim, Seoul (KR); Hwa-Kyung Kim, Seoul (KR); Hong-Seok Choi, Seoul (KR); Mi-Young Han, Paju-si (KR); Hye-Min Oh, Seoul (KR); Tae-Shick Kim, Yongin-si (KR); Seung-Hyun Kim, Gwangju (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/465,299

(22) Filed: Aug. 21, 2014

(65) Prior Publication Data

US 2015/0060812 A1     Mar. 5, 2015

(30) Foreign Application Priority Data

Aug. 29, 2013   (KR) .................. 10-2013-0103154

(51) Int. Cl.
| | | |
|---|---|---|
| *H01L 51/00* | (2006.01) | |
| *H01L 51/50* | (2006.01) | |
| *H01L 27/32* | (2006.01) | |

(52) U.S. Cl.
CPC ...... *H01L 51/5044* (2013.01); *H01L 27/3209* (2013.01)

(58) Field of Classification Search
CPC ............... H01L 51/504; H01L 51/5044; H01L 51/5262

USPC .......................................................... 257/40
See application file for complete search history.

(56) References Cited

U.S. PATENT DOCUMENTS

| | | | |
|---|---|---|---|
| 2007/0278937 A1 | 12/2007 | Forrest et al. | |
| 2008/0297036 A1* | 12/2008 | Noh ....................... | C09K 11/06 313/504 |
| 2010/0288362 A1 | 11/2010 | Hatwar et al. | |
| 2012/0248971 A1 | 10/2012 | Okuyama | |
| 2012/0299468 A1* | 11/2012 | Tsai ..................... | H01L 51/0085 313/504 |
| 2013/0146850 A1* | 6/2013 | Pieh .................... | H01L 51/5203 257/40 |

(Continued)

FOREIGN PATENT DOCUMENTS

| | | |
|---|---|---|
| CN | 103165818 A | 6/2013 |
| WO | 2006/130883 A2 | 12/2006 |
| WO | 2012/141107 A1 | 10/2012 |

*Primary Examiner* — Whitney T Moore
*Assistant Examiner* — Joseph Galvin, III
(74) *Attorney, Agent, or Firm* — Dentons US LLP (57) ABSTRACT

Disclosed herein is a white organic light emitting device including various emission layers with improved luminous efficiency, an increased color viewing angle, and low power consumption. The white organic light emitting device includes at least two charge generation layers and at least three stacks between a first electrode and a second electrode. The first stack includes an emission layer having a wavelength range of about 440 to about 470 nm, the second stack includes an emission layer having a wavelength range of about 530 to about 570 nm, and the third stack includes an emission layer having a wavelength range of about 590 to about 620 nm and an emission layer having a wavelength range of about 440 to about 470 nm.

4 Claims, 9 Drawing Sheets

(56) References Cited

U.S. PATENT DOCUMENTS

2013/0153867 A1\* 6/2013 Seo ................... H01L 51/0054
257/40
2015/0034923 A1\* 2/2015 Kim et al. .................... 257/40

\* cited by examiner

| | Voled (V) | Sub-pixel efficiency (cd/A) | | | | Panel efficiency (cd/A) | Color viewing angle Δu'v' |
|---|---|---|---|---|---|---|---|
| | | R | G | B | W | | |
| Comparative example | 13.2 | 13.1 | 32.1 | 2.1 | 100.4 | 20.1 | 0.031 |
| Embodiment 1 | 12.9 | 11.9 | 33 | 2.2 | 103.4 | 20.7 | 0.029 |
| Embodiment 2 | 12.5 | 11.1 | 35.7 | 2.5 | 105.6 | 23.8 | 0.012 |

FIG. 9

| Central peak | After movement (nm) |
|---|---|
| -20nm | 536 |
| -10nm | 546 |
| Ref. | 556 |
| +10nm | 566 |
| +20nm | 576 |

FIG. 10

| Central peak movement | R | G | B |
|---|---|---|---|
| - 20nm | 57% | 128% | 96% |
| - 10nm | 73% | 138% | 93% |
| Ref. | 108% | 117% | 102% |
| 10nm | 143% | 82% | 103% |
| 20nm | 155% | 44% | 120% |

FIG. 11

| FWHM | After adjustment (nm) |
|---|---|
| -20nm | 68 |
| -10nm | 78 |
| Ref. | 88 |
| +10nm | 98 |
| +20nm | 108 |

FIG. 12

| FWHM adjustment | R | G | B |
|---|---|---|---|
| - 10nm | 99% | 108% | 100% |
| - 20nm | 106% | 99% | 101% |
| Ref. | 108% | 117% | 102% |
| 10nm | 102% | 125% | 101% |
| 20nm | 110% | 131% | 104% |

FIG. 13

WHITE ORGANIC LIGHT EMITTING DEVICE

This application claims the benefit of Korean Patent Application No. 10-2013-0103154, filed on Aug. 29, 2013, which is hereby incorporated by reference for all purposes as if fully set forth herein.

BACKGROUND OF THE INVENTION

Field of the Invention

The present invention relates to an organic light emitting device. More particularly, the present invention relates to a white organic light emitting device including various emission layers with improved luminous efficiency, an increased color viewing angle, and low power consumption.

Discussion of the Related Art

Image display devices have become a core technology in the information communication era. The devices embody various kinds of information on a screen and have been developed such that the image display devices are thin, light, portable and have high performance. An organic light emitting device (OLED) that controls a luminance amount of an organic emission layer to display an image has been spotlighted as a flat panel display device having smaller weight and volume than a cathode ray tube (CRT).

An organic light emitting device, which is a self-emissive device having a thin emission layer disposed between two electrodes, may be configured to be thin as paper. Specifically, the organic light emitting device includes an anode, a hole injection layer (HIL), a hole transport layer (HTL), an emission layer, an electron transport layer (ETL), an electron injection layer (EIL), and a cathode.

In recent years, active research has been conducted into a white organic light emitting device having a multi-layer structure (two stacks or more) in order to further improve luminous efficiency.

That is, two or three stacks are provided and one emission layer is provided per stack to embody a white light emitting device. This white light emitting device may emit light having a white wavelength. When the white light emitting device is applied to a panel, however, luminance is low and power consumption is high due to a critical value of luminous efficiency provided by each emission layer.

Alternatively, two or three stacks can be provided and three emission layers are provided per stack to embody a white spectrum. When this white light emitting device is applied to a panel, however, luminance is still low and power consumption is high.

Figure 1:
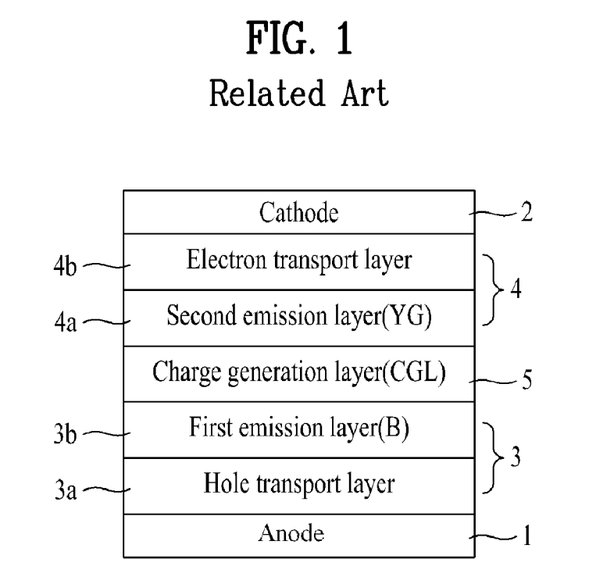
FIG. 1 is a view showing the structure of a related art two-stack white organic light emitting device.
Figure 2:
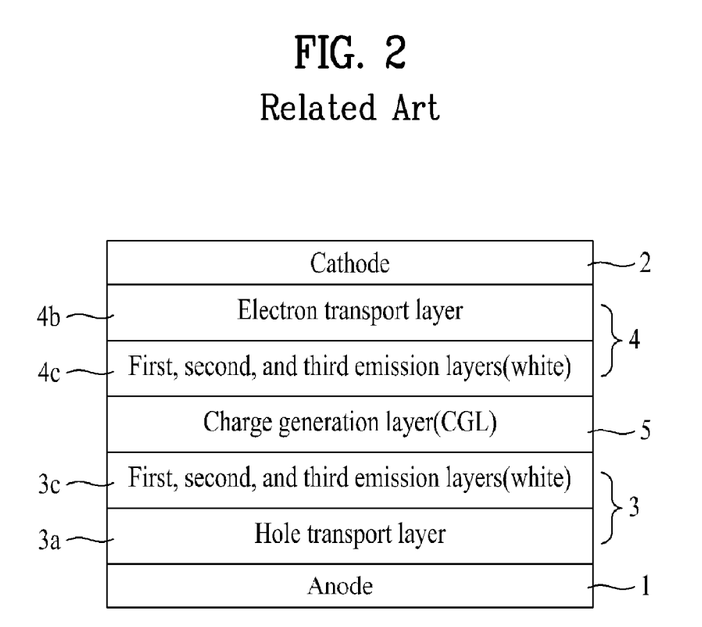
FIG. 2 is a view showing the structure of another related art two-stack white organic light emitting device.
Figure 3:
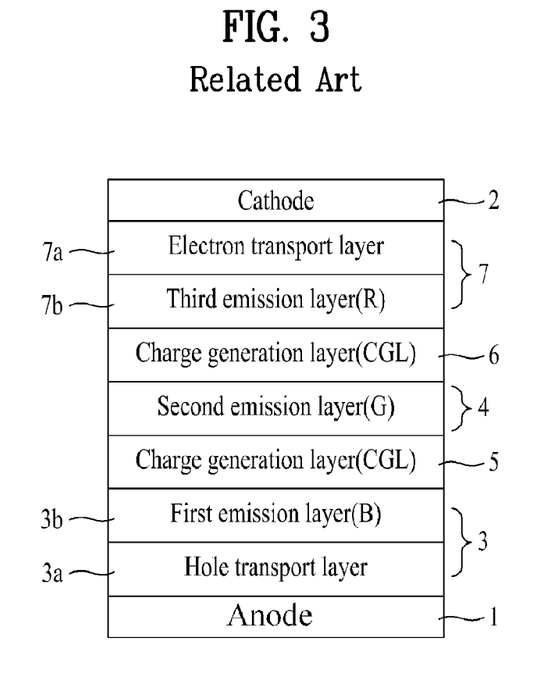
FIG. 3 is a view showing the structure of a related art three-stack white organic light emitting device.

FIG. 1 is a view showing the structure of a related art two-stack white organic light emitting device, FIG. 2 is a view showing the structure of another related art two-stack white organic light emitting device, and FIG. 3 is a view showing the structure of a related art three-stack white organic light emitting device.

As shown in FIG. 1, the related art white organic light emitting device has a structure in which a first stack 3, a charge generation layer 5, and a second stack 4 are stacked between an anode 1 and a cathode 2.

The first stack 3 includes a hole transport layer 3a and a first emission layer 3bThe second stack 4 includes a second emission layer 4a and an electron transport layer 4b. The first emission layer 3b is a blue (B) emission layer and the second emission layer 4a is a yellow-green (YG) emission layer.

As shown in FIG. 2, the related art white organic light emitting device has a structure in which a first stack 3, a charge generation layer 5, and a second stack 4 are stacked between an anode 1 and a cathode 2. The first stack 3 includes a hole transport layer 3a and three emission layers 3c. The second stack 4 also includes three emission layers 4c and an electron transport layer 4b. The three emission layers 3c and 4c include blue (B), green (G), and red (R) emission layers.

As shown in FIG. 3, the related art white organic light emitting device has a structure in which a first stack 3, a first charge generation layer 5, a second stack 4, a second charge generation layer 6, and a third stack 7 are stacked between an anode 1 and a cathode 2. The first stack 3 includes a hole transport layer 3a and a first emission layer 3b. The second stack 4 includes a second emission layer. The third stack 7 includes a third emission layer 7b and an electron transport layer 7a. The first emission layer 3b is a blue emission layer, the second emission layer is a green emission layer, and the third emission layer 7b is a red emission layer.

In the related art white organic light emitting devices, each charge generation layer is formed between the respective stacks to adjust a charge balance between the respective stacks.

However, the related art white organic light emitting devices have the following problems.

The related art white organic light emitting devices shown in FIGS. 1 and 3 have similar characteristics. However, the related art white organic light emitting device shown in FIG. 1 has a smaller number of layers and a smaller overall thickness than the related art white organic light emitting device shown in FIG. 3. Consequently, the related art white organic light emitting device shown in FIG. 1 may have lower drive voltage and emit light having a white wavelength. Because it is necessary to cover three peaks using two peaks, however, in the related art white organic light emitting device shown in FIG. 1, luminance is low and power consumption is high due to a critical value of luminous efficiency provided by each emission layer when the white organic light emitting device is applied to a panel. In addition, in the related art white organic light emitting device shown in FIG. 1, a color viewing angle is limited due to each layer and an optical path based on a thickness corresponding thereto.

In the related art white organic light emitting device shown in FIG. 2, each stack has low luminous efficiency and a short life span. Although the stacks are stacked, a color viewing angle is greatly limited and there are many color shifts.

SUMMARY OF THE INVENTION

Accordingly, the present invention is directed to a white organic light emitting device that substantially obviates one or more problems due to limitations and disadvantages of the related art.

An advantage of the present invention is to provide a white organic light emitting device including various emission layers, which is capable of providing a panel with improved luminous efficiency, an increased color viewing angle, and low power consumption.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a white organic light emitting device includes at least two charge generation layers and at least three stacks between a first electrode and a second electrode, wherein the first stack includes an emission layer having a wavelength range of about 440 to about 470 nm, the second stack includes an emission layer having a wavelength range of about 530 to about 570 nm, and the third stack includes an emission layer having a wavelength range of about 590 to about 620 nm and an emission layer having a wavelength range of about 440 to about 470 nm.

The at least three stacks may include 4 to 14 emission layers, at least two of the 4 to 14 emission layers may have different spectrums, and the 4 to 14 emission layers may include red, green, blue, yellow-green (YG), green-yellow, orange, and violet phosphorescent/fluorescent emission layers.

In another aspect of the present invention, a white organic light emitting device includes a first stack, a first charge generation layer, a second stack, a second charge generation layer, and a third stack sequentially arranged between a first electrode and a second electrode, wherein the first stack includes a blue zone emission layer, the second stack includes a yellow-green zone emission layer, and the third stack includes a red zone emission layer and a blue zone emission layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 4:
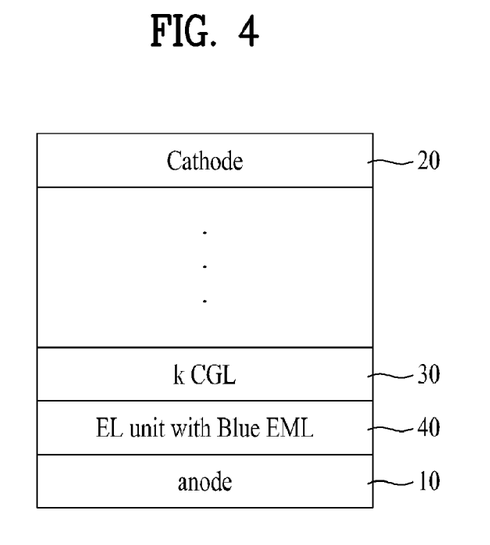
FIG. 4 is a view schematically showing the structure of a white organic light emitting device according to the present invention.

FIG. 4 is a view schematically showing construction of a white organic light emitting device according to the present invention.

As shown in FIG. 4, the white organic light emitting device of the present invention includes at least two charge generation layers 30 and at least three stacks 40 between an anode 10 and a cathode 20.

The first stack includes an emission layer having a wavelength range of about 440 to about 470 nm, the second stack includes an emission layer having a wavelength range of about 530 to about 570 nm, and the third stack includes an emission layer having a wavelength range of about 590 to about 620 nm and an emission layer having a wavelength range of about 440 to about 470 nm.

Four (4) to fourteen (14) emission layers are provided in the at least three stacks 40. At least two of the 4 to 14 emission layers have different spectrums. The 4 to 14 emission layers may include red, green, blue, yellow-green (YG), green-yellow, orange, and violet phosphorescent/fluorescent emission layers.

The emission layer of the stack closest to the anode 10 is a blue emission layer. The white organic light emitting device of the present invention has a color temperature of 5500K to 13000K.

A first embodiment of the white organic light emitting device with the above-stated construction will be described.

Figure 5:
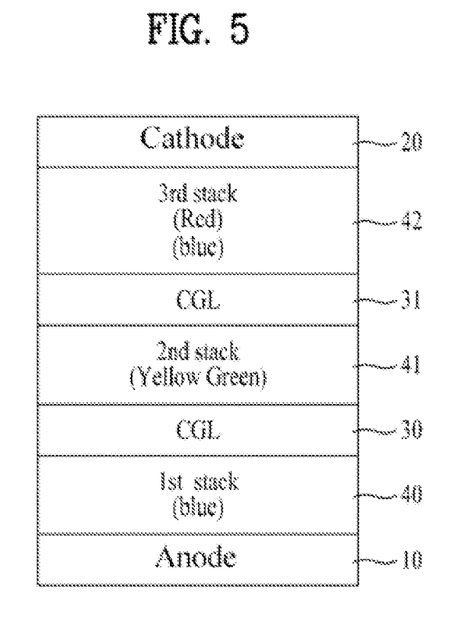
FIG. 5 is a view showing the structure of a white organic light emitting device according to a first embodiment of the present invention.

FIG. 5 is a view showing the structure of a white organic light emitting device according to a first embodiment of the present invention.

As shown in FIG. 5, the white organic light emitting device according to a first embodiment of the present invention includes a first stack 40, a first charge generation layer 30, a second stack 41, a second charge generation layer 31, and a third stack 42 between an anode 10 and a cathode 20.

The anode 10 is formed, for example, of indium tin oxide (ITO) or indium zinc oxide (IZO). The cathode 20 is formed, for example, of a reflective metal material, such as aluminum (Al), gold (Au), molybdenum (Mo), chrome (Cr), copper (Cu), LiF, or an alloy of aluminum and LiF.

The first and second charge generation layers (CGLs) 30 and 31 are formed between the stacks to adjust a charge balance between the respective stacks. Although not shown, the first and second charge generation layers 30 and 31 each include an N-type organic layer formed adjacent to the lower stack to inject electrons into the lower stack and a P-type organic layer formed adjacent to the upper stack to inject holes into the upper stack.

The first stack 40 includes an emission layer having a wavelength range of about 440 to about 470 nm, the second stack 41 includes an emission layer having a wavelength range of about 530 to about 570 nm, and the third stack 42 includes an emission layer having a wavelength range of about 590 to about 620 nm and an emission layer having a wavelength range of about 440 to about 470 nm.

Fluorescent blue is presently applied to products. However, the fluorescent blue has a theoretical luminous efficiency limiting value of about 13%. As a result, it is difficult to embody a high-performance white organic light emitting device. For this reason, the first stack 40 includes only one blue zone emission layer.

The second stack 41 includes only one yellow-green zone emission layer.

The third stack 42 includes one red zone emission layer and one blue zone emission layer. When a color temperature of a white organic light emitting device for displays is high, consumer appeal is also high. For this reason, one blue zone emission layer may be further added to increase the color temperature. In addition, in most optical cavities, red and blue zones are adjacent to each other in terms of thickness. When the red emission layer and the blue emission layer are disposed adjacent to each other as described above, it is possible to easily construct the white organic light emitting device.

Figure 6:
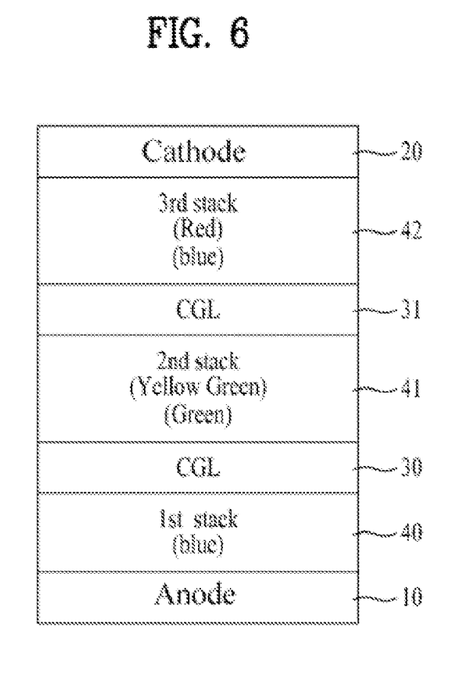
FIG. 6 is a view showing the structure of a white organic light emitting device according to a second embodiment of the present invention.

FIG. 6 is a view showing the structure of a white organic light emitting device according to a second embodiment of the present invention.

As shown in FIG. 6, the white organic light emitting device includes a first stack 40, a first charge generation layer 30, a second stack 41, a second charge generation layer 31, and a third stack 42 between an anode 10 and a cathode 20.

The anode 10 is formed of, for example, indium tin oxide (ITO) or indium zinc oxide (IZO). The cathode 20 is formed of, for example, a reflective metal material, such as aluminum (Al), gold (Au), molybdenum (Mo), chrome (Cr), copper (Cu), LiF, or an alloy of aluminum and LiF.

The first and second charge generation layers (CGLs) 30 and 31 are formed between the stacks to adjust a charge balance between the respective stacks. Although not shown, the first and second charge generation layers 30 and 31 each include an N-type organic layer formed adjacent to the lower stack to inject electrons into the lower stack and a P-type organic layer formed adjacent to the upper stack to inject holes into the upper stack.

The first stack 40 includes an emission layer having a wavelength range of about 440 to about 470 nm, the second stack 41 includes two emission layers each having a wavelength range of about 530 to about 570 nm, and the third stack 42 includes an emission layer having a wavelength range of about 590 to about 620 nm and an emission layer having a wavelength range of about 440 to about 470 nm.

Fluorescent blue is presently applied to products. However, fluorescent blue has a theoretical luminous efficiency limiting value of about 13%. As a result, it is difficult to embody a high-performance white organic light emitting device. For this reason, the first stack 40, which is closest to the anode, includes only one blue zone emission layer.

The second stack 41 includes two green zone emission layers. The green zone may be divided into green and yellow-green. A green zone emission layer and a yellow-green zone emission layer are used to alleviate sensitivity in green luminous efficiency which may be generated from the green zone depending upon the thickness of the device through the addition of the emission layer having the yellow-green wavelength.

The third stack 42 includes one red zone emission layer and one blue zone emission layer. When a color temperature of a white organic light emitting device for displays is high, consumer appeal is also high. For this reason, one blue zone emission layer may be further added to increase the color temperature. In addition, in most optical cavities, red and blue zones are adjacent to each other in terms of thickness. When the red emission layer and the blue emission layer are disposed adjacent to each other as described above, it is possible to easily construct the white organic light emitting device.

In a case in which the red zone emission layer and the blue zone emission layer are used in the third stack, luminous efficiency of the red zone emission layer may be lower than in a case in which only the red zone emission layer is used in the third stack. However, luminous efficiency of the red zone emission layer may be increased by the yellow-green zone emission layer used in the second stack 41 together with the green zone emission layer.

Although not shown, in the white organic light emitting device according to the first and second embodiments of the present invention, the first stack 40 may include a hole injection layer adjacent to the anode 10, the third stack 42 may include an electron injection layer adjacent to the cathode 20, and an electron transport layer and a hole transport layer may be formed on and under the emission layers of the first to third stacks.

Figure 7:
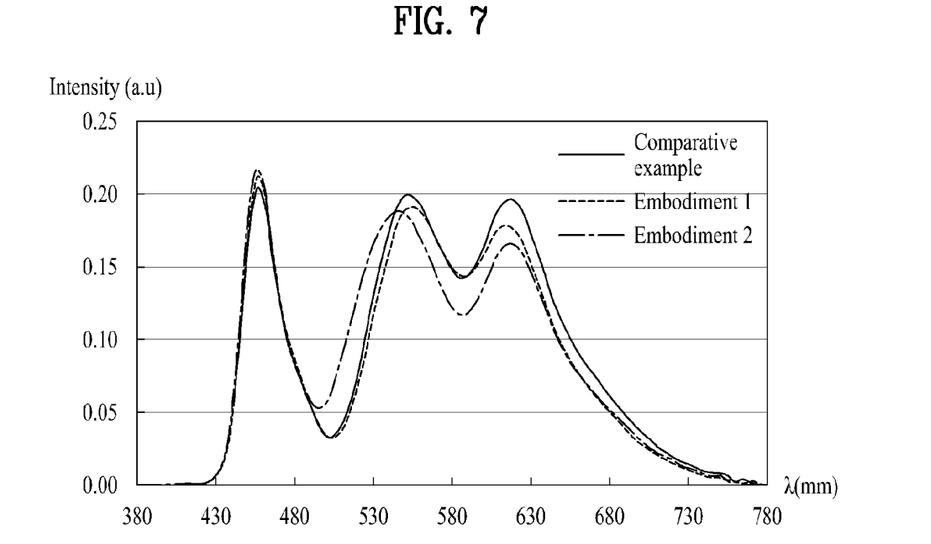
FIG. 7 is a graph showing comparison in characteristics of the white organic light emitting device between the first and second embodiments and a comparative example.
Figure 8:
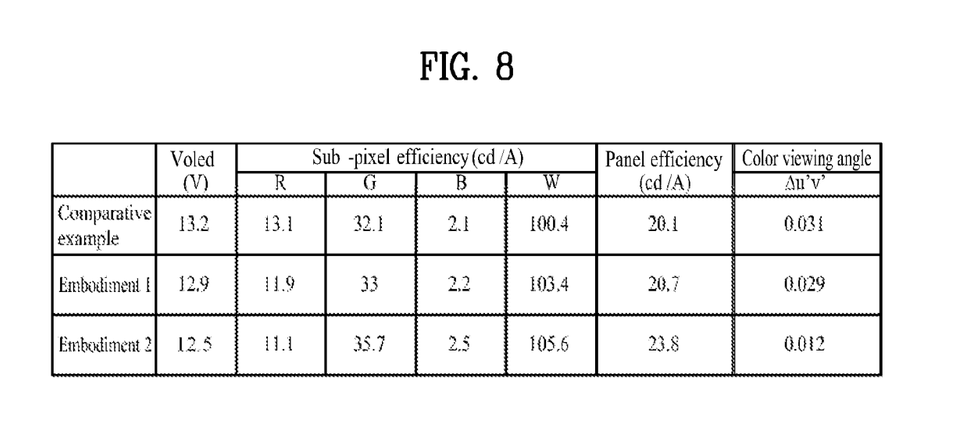
FIG. 8 is a table showing comparison in characteristics of the white organic light emitting device between the first and second embodiments and the comparative example.

FIG. 7 is a graph showing a comparison of characteristics of the white organic light emitting device between the first and second embodiments and a comparative example, and FIG. 8 is a table showing comparison of data of characteristics of the white organic light emitting device between the first and second embodiments and the comparative example.

The white organic light emitting device according to the comparative example includes a first stack 40, a first charge generation layer 30, a second stack 41, a second charge generation layer 31, and a third stack 42 between an anode 10 and a cathode 20, as in the first and second embodiments of the present invention. However, in the comparative example, the first stack 40 includes only one blue zone emission layer, the second stack 41 includes one yellow-green zone emission layer, and the third stack 42 includes one red zone emission layer.

As shown in FIG. 8, when the white organic light emitting device according to the first and second embodiments of the present invention is applied to a panel, drive voltage Voled (voltage applied to the panel during driving of white color) is lower than that of the comparative example.

In addition, a color viewing angle (a value indicating change of color coordinates measured at an angle of 60 degrees to the front of the panel) of the white organic light emitting device according to the first and second embodiments of the present invention is lower than that of the comparative example.

Furthermore, panel efficiency (efficiency of average luminance obtained during driving of various videos) of the white organic light emitting device according to the first and second embodiments of the present invention is higher than that of the comparative example.

When the white organic light emitting device according to each embodiment of the present invention is applied to a panel, each unit pixel may include four R, G, B, and W sub-pixels or three R, G, and B sub-pixels.

Meanwhile, in a three-stack, three-peak structure as in the white organic light emitting device according to the first embodiment of the present invention, the central peak of a photoluminescence (PL) wavelength of the phosphorescent yellow-green emission layer of the second stack is 556 nm and full width at half maximum (FWHM) of the emission layer is 88 nm. The central peak of the wavelength of the phosphorescent yellow-green emission layer may be moved or the FWHM of the emission layer may be adjusted to maximize panel efficiency.

Figure 9:
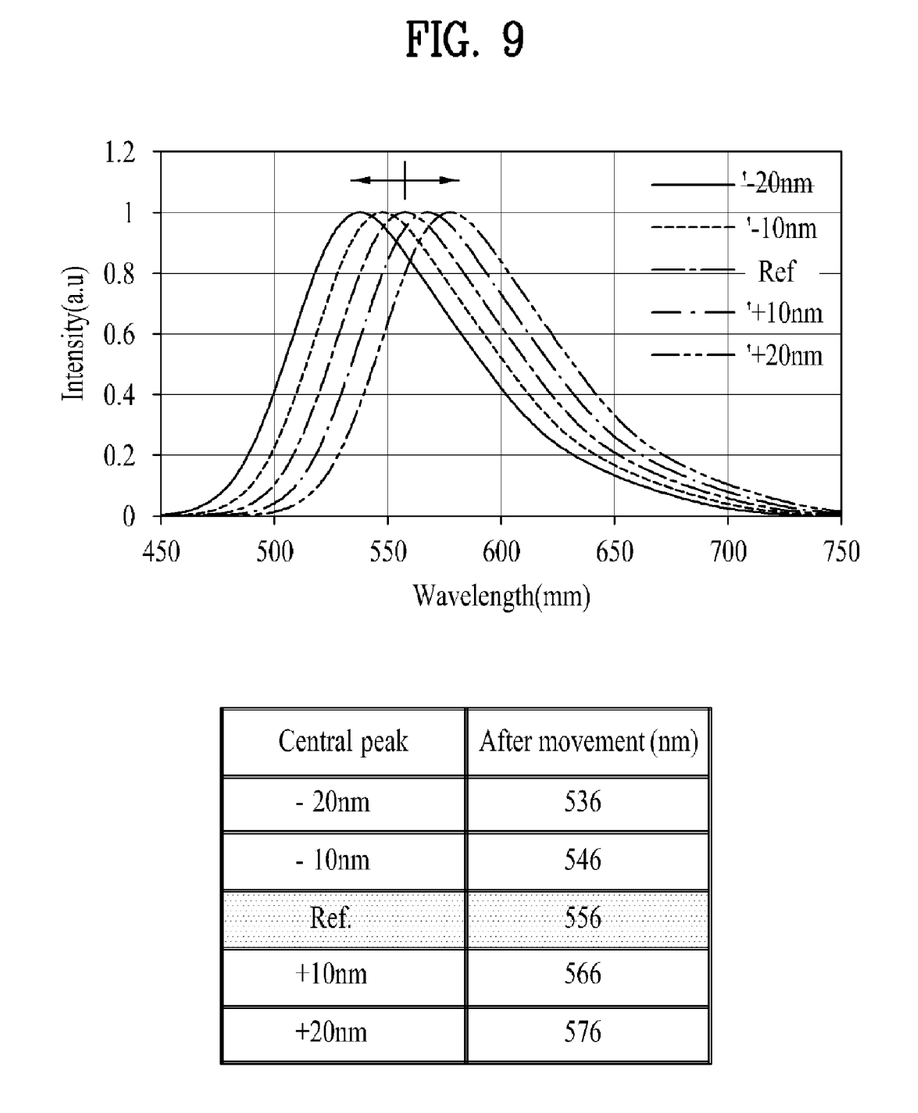
FIG. 9 is a graph and a table showing spectrums of a phosphorescent yellow-green emission layer of a second stack according to the present invention when a photoluminescence (PL) central peak of the emission layer is moved −10 nm, −20 nm, +10 nm, and +20 nm.
Figure 10:
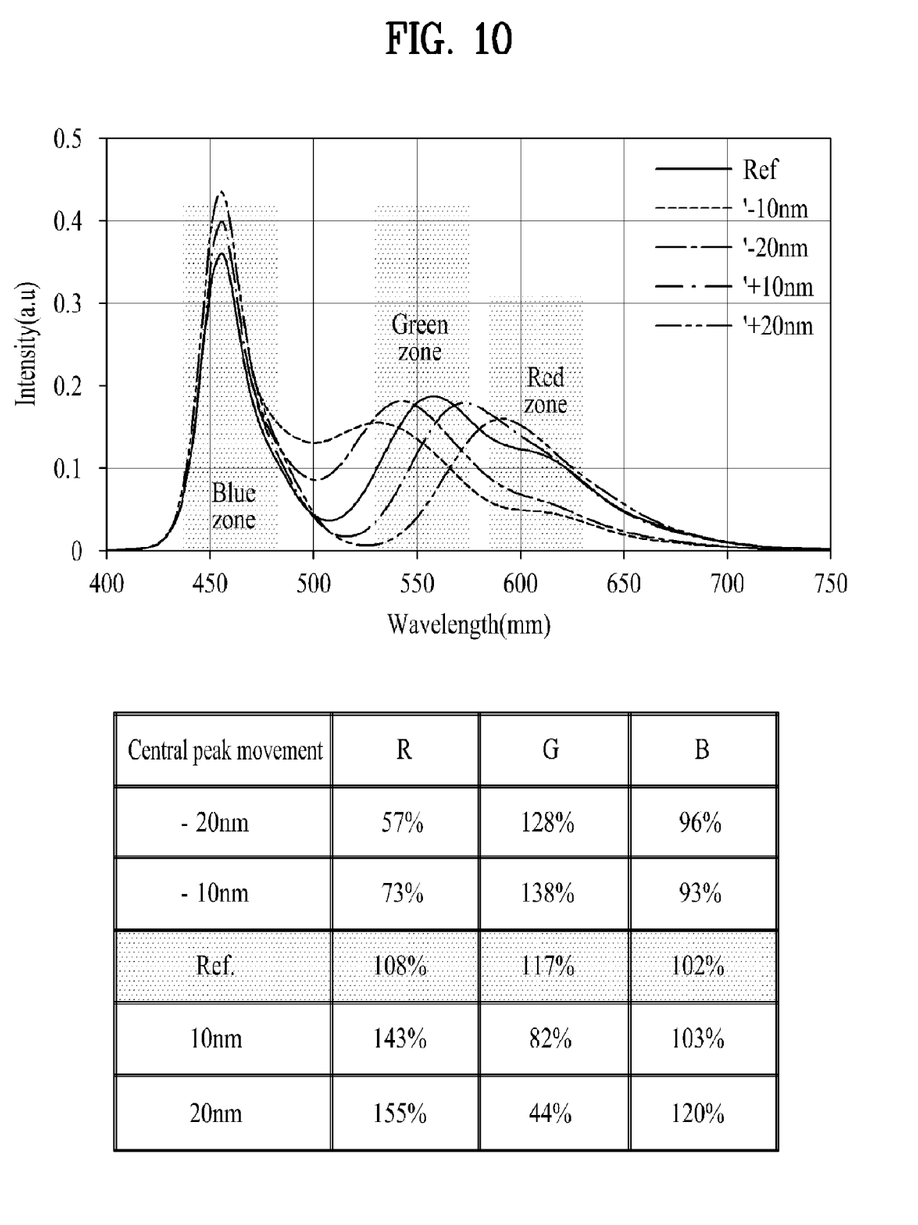
FIG. 10 is a graph and a table showing panel efficiency of red (R), green (G), and blue (B) zones based on experimental results according to FIG. 9.

FIG. 9 is a graph and a table showing spectrums of the phosphorescent yellow-green emission layer of the second stack according to the present invention when the PL central peak of the emission layer is moved −10 nm, −20 nm, +10 nm, and +20 nm and FIG. 10 is a graph and a table showing panel efficiency of red (R), green (G), and blue (B) zones based on experimental results according to FIG. 9.

When the PL central peak of the phosphorescent yellow-green emission layer is moved to short wavelength sides (−10 nm and −20 nm) as shown in FIG. 9, the red (R) zone is insufficient as shown in FIG. 10. On the other hand, when the PL central peak of the phosphorescent yellow-green emission layer is moved to long wavelength sides (+10 nm and +20 nm) as shown in FIG. 9, the green (G) zone is insufficient as shown in FIG. 10. Consequently, the PL central peak of the phosphorescent yellow-green emission layer is set to 540 to 570 nm.

Figure 11:
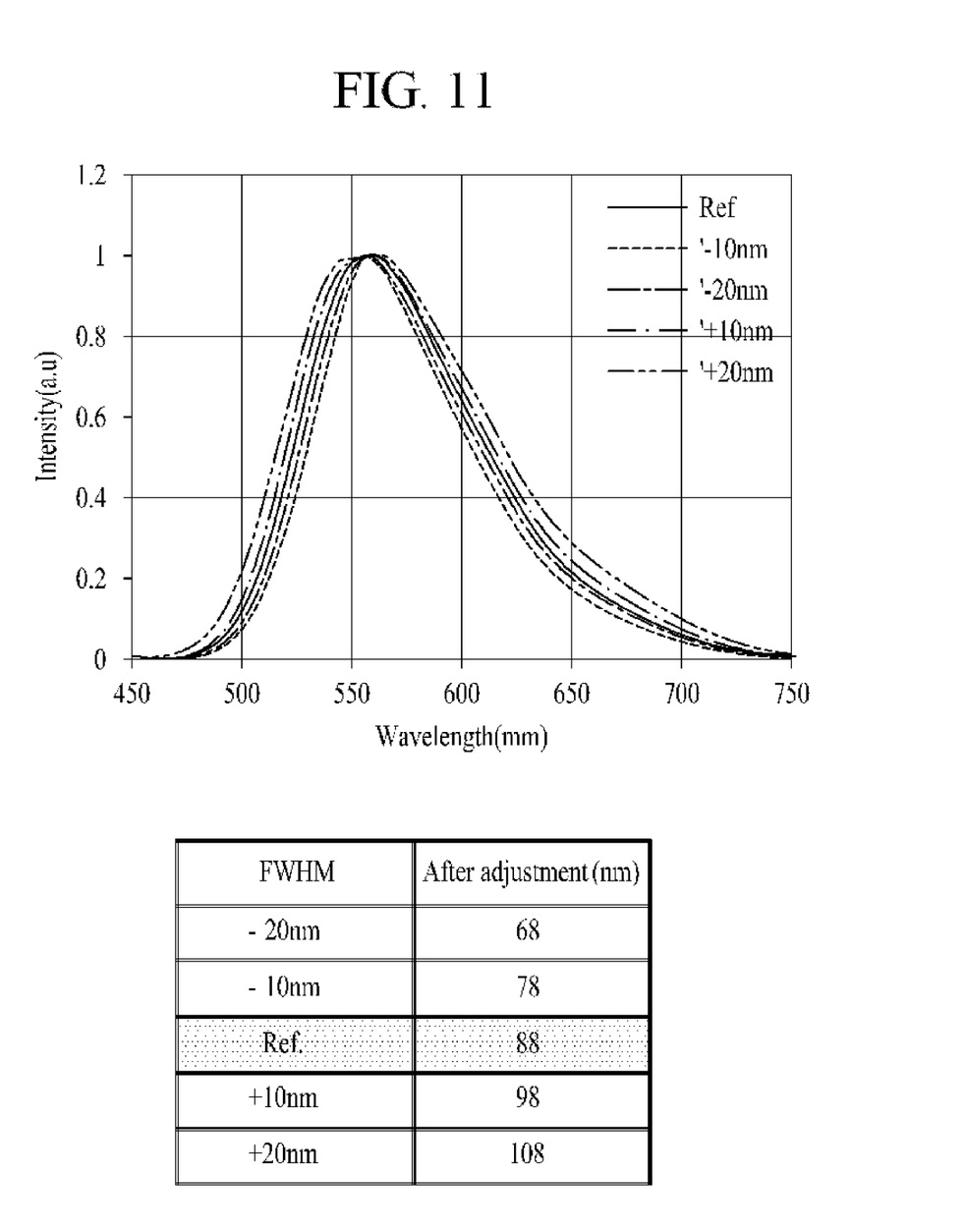
FIG. 11 is a graph and a table showing spectrums of the phosphorescent yellow-green emission layer of the second stack according to the present invention when full width at half maximum (FWHM) of the emission layer is adjusted to a −10 nm, −20 nm, +10 nm, and +20 nm.
Figure 12:
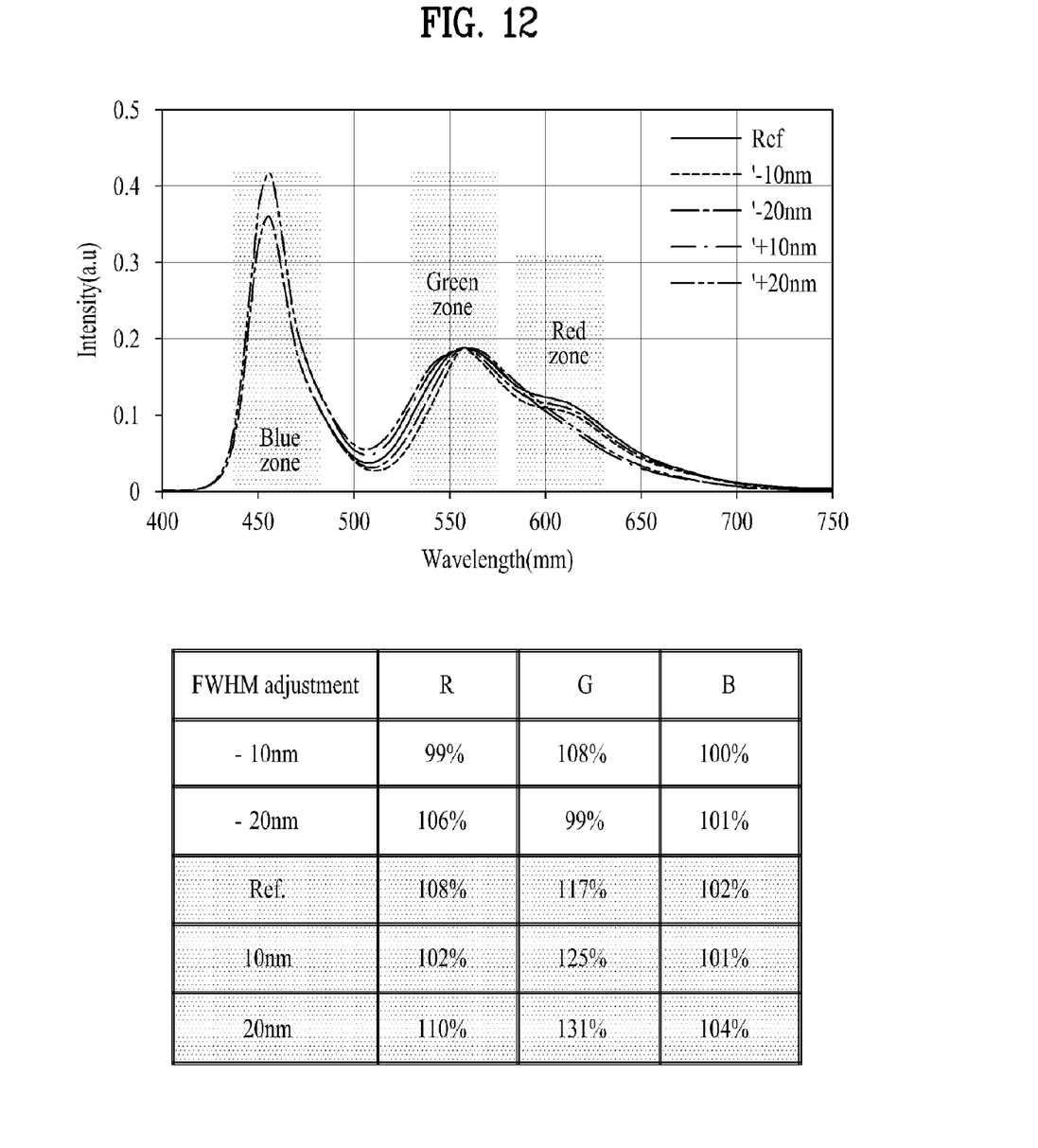
FIG. 12 is a graph and a table showing panel efficiency of red (R), green (G), and blue (B) zones based on experimental results according to FIG. 11.

FIG. 11 is a graph and a table showing spectrums of the phosphorescent yellow-green emission layer of the second stack according to the present invention when FWHM of the emission layer is adjusted to a −10 nm, −20 nm, +10 nm, and +20 nm and FIG. 12 is a graph and a table showing panel efficiency of red (R), green (G), and blue (B) zones based on experimental results according to FIG. 11.

When FWHM of the yellow-green emission layer is increased as shown in FIG. 11, satisfactory results may be obtained as shown in FIG. 12. That is, efficiency is lowered in the PL having FWHM less than reference. Consequently, FWHM of the yellow-green emission layer is set to 75 nm or more.

Figure 13:
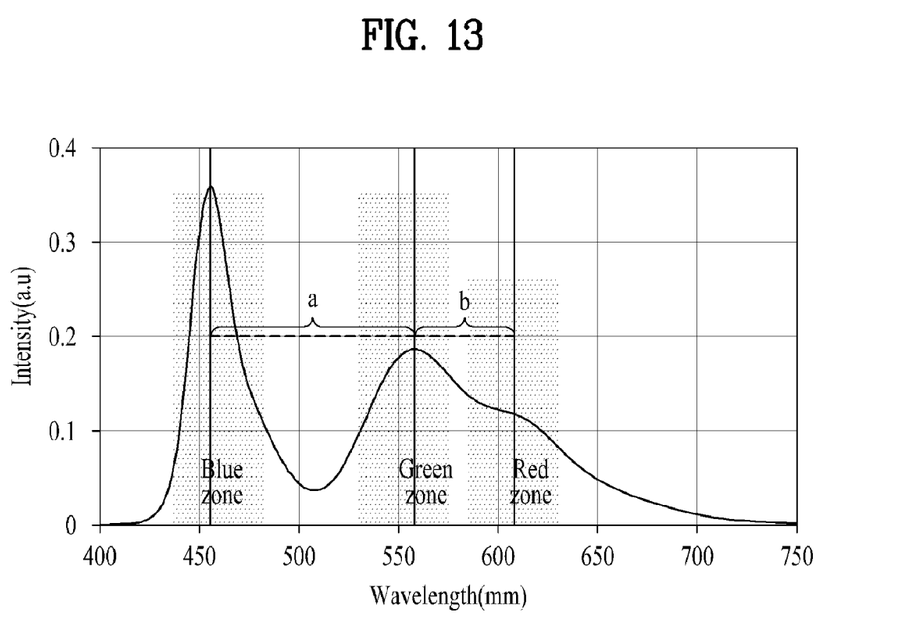
FIG. 13 is a graph showing distances between wavelengths based on a high-efficiency spectrum according to the present invention.

FIG. 13 is a graph showing distances between wavelengths based on a high-efficiency spectrum according to the present invention.

As shown in FIG. 13, overall efficiency is optimized when a distance a between the blue (B) zone and the green (G) zone is equal to or greater than a distance b between the green (G) zone and the red (R) zone (b≤a).

As is apparent from the above description, the white organic light emitting device according to the present invention includes various emission layers. Consequently, drive voltage is lowered, a color viewing angle, which is a value indicating change of color coordinates measured at an angle of 60 degrees to the front of a panel, is improved, and average luminance (panel efficiency) obtained during driving of various videos is improved.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A white organic light emitting device, comprising:
    a first stack, a first charge generation layer, a second stack, a second charge generation layer, and a third stack arranged sequentially between a first electrode and a second electrode,
    wherein the first stack comprises a single blue zone emission layer, the second stack comprises a yellow-green zone emission layer, and the third stack comprises a red zone emission layer and a blue zone emission layer,
    wherein the second stack further comprises a green zone emission layer, and
    wherein the yellow-green zone emission layer has a full width at half maximum of 75 nm or more.

2. The white organic light emitting device according to claim 1, wherein the first electrode is an anode, and the second electrode is a cathode.

3. The white organic light emitting device according to claim 1, wherein a distance "a" between a central peak of the wavelength range of the first stack in the blue zone and a central peak of the wavelength range of the second stack in the yellow-green zone is equal to or greater than a distance "b" between the central peak of the wavelength range of the yellow-green zone and a central peak of the wavelength range of the third stack in the red zone.

4. A white organic light emitting device, comprising:
    at least two charge generation layers and at least three stacks between a first electrode and a second electrode,
    wherein the first stack comprises only one emission layer having a wavelength range of about 440 to about 470 nm, the second stack comprises a first emission layer and a second emission layer, each of the first and second emission layers having a wavelength range of about 530 to about 570 nm, and the third stack comprises a first emission layer having a wavelength range of about 590 to about 620 nm and a second emission layer having a wavelength range of about 440 to about 470 nm, and
    wherein a distance between a central peak of the wavelength range of the first stack and a central peak of the wavelength range of the second stack is equal to or greater than a distance between the central peak of the second stack and a central peak of the wavelength ranges of the third stack.

* * * * *